United States Patent
Uchida et al.

(10) Patent No.: US 7,232,529 B1
(45) Date of Patent: Jun. 19, 2007

(54) POLISHING COMPOUND FOR CHEMIMECHANICAL POLISHING AND POLISHING METHOD

(75) Inventors: Takeshi Uchida, Ibaraki (JP); Yasuo Kamigata, Ibaraki (JP); Hiroki Terasaki, Ibaraki (JP); Yasushi Kurata, Ibaraki (JP); Tetsuya Hoshino, Ibaraki (JP); Akiko Igarashi, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 407 days.

(21) Appl. No.: 10/069,404

(22) PCT Filed: Aug. 25, 2000

(86) PCT No.: PCT/JP00/05765

§ 371 (c)(1),
(2), (4) Date: May 6, 2002

(87) PCT Pub. No.: WO01/17006

PCT Pub. Date: Mar. 8, 2001

(30) Foreign Application Priority Data

| Aug. 26, 1999 | (JP) | ................................. 11-239777 |
| Aug. 26, 1999 | (JP) | ................................. 11-239778 |
| Aug. 26, 1999 | (JP) | ................................. 11-239779 |
| Aug. 26, 1999 | (JP) | ................................. 11-239780 |
| Aug. 26, 1999 | (JP) | ................................. 11-239781 |

(51) Int. Cl.
*C09K 13/00* (2006.01)
*C09K 13/04* (2006.01)
*C09K 13/06* (2006.01)
*H01L 21/302* (2006.01)

(52) U.S. Cl. .................. 252/79.1; 252/79.2; 252/79.4; 438/692

(58) Field of Classification Search ............... 252/79.1, 252/79.2, 79.4; 438/692
See application file for complete search history.

(56) References Cited

U.S. PATENT DOCUMENTS 4,752,628 A  6/1988  Payne ........................ 523/122

(Continued)

FOREIGN PATENT DOCUMENTS

EP  0 560 324 A1  9/1993

(Continued)

OTHER PUBLICATIONS

Costas et al., Composition for Insulator and Metal CMP and Methods Relating Thereto, Mar. 1, 2001, WO 01/14496.*

(Continued)

*Primary Examiner*—Nadine Norton
*Assistant Examiner*—Lynette T. Umez-Eronini
(74) *Attorney, Agent, or Firm*—Antonelli, Terry, Stout & Kraus, LLP.

(57) ABSTRACT

This invention provides a polishing medium for CMP, comprising an oxidizing agent, a metal-oxide-dissolving agent, a protective-film-forming agent, a water-soluble polymer, and water, and a polishing method making use of this polishing medium. Also, it is preferable that the water-soluble polymer has a weight-average molecular weight of 500 or more and the polishing medium has a coefficient of kinetic friction of 0.25 or more, a Ubbelode's viscosity of from 0.95 mPa·s (0.95 cP) to 1.5 mPa·s (1.5 cP) and a point-of-inflection pressure of 5 kPa (50 gf/cm$^2$).

6 Claims, 1 Drawing Sheet

U.S. PATENT DOCUMENTS

| | | | |
|---|---|---|---|
| 4,956,015 A * | 9/1990 | Okajima et al. | 106/3 |
| 5,352,277 A | 10/1994 | Sasaki | 106/6 |
| 5,630,950 A * | 5/1997 | Cangelosi | 216/106 |
| 5,733,819 A * | 3/1998 | Kodama et al. | 438/692 |
| 5,770,095 A | 6/1998 | Sasaki et al. | |
| 5,860,848 A | 1/1999 | Loncki et al. | 451/36 |
| 6,007,592 A * | 12/1999 | Kasai et al. | 51/309 |
| 6,194,317 B1 * | 2/2001 | Kaisaki et al. | 438/692 |
| 6,319,096 B1 * | 11/2001 | Mueller et al. | 451/41 |
| 6,896,825 B1 | 5/2005 | Uchida et al. | |
| 6,899,821 B2 | 5/2005 | Uchida et al. | |
| 2001/0054706 A1 * | 12/2001 | Levert et al. | 252/79.1 |
| 2002/0016073 A1 * | 2/2002 | Kondo et al. | 438/691 |
| 2005/0095860 A1 | 5/2005 | Uchida et al. | |

FOREIGN PATENT DOCUMENTS

| | | |
|---|---|---|
| EP | 0 846 742 A2 | 6/1998 |
| EP | 0 913 442 A2 | 5/1999 |
| EP | 1 137 056 A1 | 9/2001 |
| EP | 1 211 717 A1 | 6/2002 |
| JP | 05-104436 | 4/1993 |
| JP | 09-055363 | 2/1997 |
| JP | 09-063996 | 3/1997 |
| JP | 09-194823 | 7/1997 |
| JP | 9-194824 | 7/1997 |
| JP | 10-152673 | 6/1998 |
| JP | 10-168431 | 6/1998 |
| JP | 10-321566 | 12/1998 |
| JP | 11-021546 | 1/1999 |
| JP | 11-116942 | 4/1999 |
| JP | 11-195628 | 7/1999 |
| JP | 2000-049124 | 2/2000 |
| JP | 3337464 B2 | 8/2002 |
| JP | 3337464 B2 | 10/2002 |
| JP | 2001-520456 | 12/2005 |
| WO | WO 98/49723 | 11/1998 |
| WO | WO00/39844 | 7/2000 |
| WO | WO 00/13217 | 9/2000 |
| WO | WO 00/68332 | 11/2000 |
| WO | WO 01/14496 A1 | 3/2001 |

OTHER PUBLICATIONS

Communication, from the Japanese Patent Office for a corresponding Japanese patent application, No. 2001-520456, dated Jun. 22, 2005.

*Handbook for Surfactant* (Oct. 1, 1987), pp. 252 and 253.

"Notification for Form for Production of Publications etc.", for Application No. JP 2001-520456, dated Mar. 28, 2006.

Supplementary European Search Report, for Application No. EP 00 95 5039, dated Jan. 26, 2006.

Official Action (Notification for Reasons for Refusal); issued Jun. 27, 2006, for JP 2001-520456.

Notificaton, issued Mar. 28, 2006, for JP 2001-520456.

JP 11-195628.

JP 11-21546.

JP 11-116942.

JP 9-55636.

JP 10-168431.

JP 10-152673.

JP 5-104436.

JP 9-194823.

JP 9-63996.

JP 10-321566.

JP 2000-49124.

WO 00-13217.

Supplementary European Search Report, Jan. 26, 2006.

Q. Luo et al.: Chemical-Mechanical Polishing of Copper in Acidic Media: 92/22/1996: pp. 145-151.

T. Grchev, et al.: The Electrochemical Testing of Polyacrylic Acid and its Derivatives as Inhibitors of Corrosion: Corrision Science, vol. 32, No. 1, pp. 103-112, 1991.

* cited by examiner

POLISHING COMPOUND FOR CHEMIMECHANICAL POLISHING AND POLISHING METHOD

TECHNICAL FIELD

This invention relates to a polishing medium for chemical-mechanical polishing, especially suited for polishing in the step of forming wirings of semiconductor devices, and a polishing method making use of the same.

BACKGROUND ART

In recent years, as semiconductor integrated circuits (hereinafter "LSI") are made high-integration and high-performance, new techniques for fine processing have been developed. Chemical-mechanical polishing (hereinafter "CMP") is also one of them. The CMP is often used in LSI fabrication steps, in particular, in making interlaminar insulating films flat in the step of forming multilayer wirings, in forming metallic plugs and in forming buried wirings. This technique is disclosed in, e.g., U.S. Pat. No. 4,944,836.

Recently, in order to make LSIs high-performance, it is also attempted to utilize copper alloys as wiring materials. It, however, is difficult for the copper alloys to be finely processed by dry etching often used in forming conventional aluminum alloy wirings. Accordingly, what is called the damascene method is chiefly employed, in which a copper alloy thin film is deposited on an insulating film with grooves formed previously and is buried therein, and the copper alloy thin film at the part except the grooves is removed by CMP to form buried wirings. This technique is disclosed in, e.g., Japanese Patent Application Laid-open No. 2-278822.

In a common method of polishing metals by the CMP, a polishing pad is fastened onto a circular polishing roller (platen), and the surface of the polishing pad is soaked with a polishing medium for chemical-mechanical polishing, where a substrate with a metal film formed thereon is pressed against the pad on the former's metal film side and a stated pressure (hereinafter "polishing pressure") is applied thereto on the back thereof, in the state of which the polishing platen is turned to remove the metal film at the part of its hills by mechanical friction acting between the polishing medium and the metal film.

The polishing medium used in such CMP is commonly comprised of an oxidizing agent and solid abrasive grains, to which a metal-oxide-dissolving agent and/or a protective-film-forming agent are optionally added. The basic mechanism of CMP making use of this polishing medium for CMP is considered to be that the metal film surface is oxidized with the oxidizing agent and the resultant oxide layer is scraped with the solid abrasive grains. The metal surface oxide layer at the part of dales does not come into contact with the polishing pad so much and the effect of scraping attributable to the solid abrasive grains does not extend thereto. Hence, with progress of the CMP, the metal layer becomes removed at its hills and the substrate (with film) surface become flat. Details on this matter are disclosed in Journal of Electrochemical Society, Vol. 138, No. 11 (published 1991), pages 3460-3464.

In order to make higher the rate of polishing by CMP, it is considered effective to add the metal-oxide-dissolving agent. It can be explained that this is because the effect of scraping attributable to the solid abrasive grains comes higher where grains of metal oxide scraped off by the solid abrasive grains are made to dissolve in the polishing medium. However, the addition of the metal-oxide-dissolving agent makes the metal film surface oxide layer dissolve (hereinafter "etching") also at the part of dales, and the metal film surface becomes uncovered, so that the metal film surface is further oxidized by the oxidizing agent. With repetition of this, the etching of the metal film may proceed at the part of dales, resulting in a damage of the effect of flattening.

In order to prevent this, the protective-film-forming agent is further added to the metal-polishing medium for CMP. Thus, adding the metal-oxide-dissolving agent and protective-film-forming agent adds the effect of chemical reaction, and this brings about the effect that the CMP rate (the rate of polishing by CMP) is improved and also any injury (damage) of the metal layer surface to be polished by CMP may less occur.

In order to obtain a flat polished surface, it is important to balance the effect attributable to the metal-oxide-dissolving agent and protective-film-forming agent used in the polishing medium for CMP. In the CMP, it is preferable to use a polishing medium which does not etch the metal film surface oxide layer so much at the part of dales, dissolves in a good efficiency the particles of the oxide layer scraped off, and has a high rate of polishing.

However, the formation of buried wirings by CMP using a conventional polishing medium for chemical-mechanical polishing which contain solid abrasive grains involves the problems such that;

(1) it may cause a phenomenon that the surface of the metal wiring having been buried is isotropically corroded at the middle thereof to become hollow like a dish (hereinafter "dishing");

(2) it may cause polishing mars (scratches) arising from solid abrasive grains;

(3) the wash processing to remove solid abrasive grains remaining on the substrate surface after polishing is troublesome; and (4) a cost increase may arise because of the prime cost of solid abrasive grains themselves and the disposal of waste liquor.

Accordingly, in order to keep the dishing from occurring or the copper alloy from corroding during the polishing, to form highly reliable LSI wirings, a polishing method making use of a polishing medium for CMP which contains a metal-oxide-dissolving agent comprised of amino acetic acid (e.g., glycine) or amidosulfuric acid and contains BTA (benzotriazole) is proposed. This technique is disclosed in, e.g., Japanese Patent Application Laid-open No. 8-83780.

However, the BTA has a very high protective-film-forming effect, and hence it may greatly lower not only the rate of etching but also the rate of polishing. Accordingly, it is sought to provide a polishing medium for CMP which lowers the etching rate sufficiently but does not lower the CMP rate.

DISCLOSURE OF THE INVENTION

An object of the present invention is to provide a polishing medium for CMP and a polishing method which can form highly reliable buried metal film patterns in a good efficiency by making the etching rate sufficiently low while keeping a high CMP rate.

As the protective-film-forming agent, a compound by which a chelate complex is readily formed with copper is used, such as ethylenediaminetetraacetic acid or benzotriazole. Such a compound has a very strong effect of forming a protective film on the surface to be polished. For example, if it is incorporated in the polishing medium for CMP in an amount of 0.5% by weight or more, the copper alloy film comes not subject to CMP, to say nothing of etching.

In this regard, the present inventors have discovered that the use of the protective-film-forming agent in combination with a water-soluble polymer enables achievement of a high CMP rate while keeping a sufficiently low etching rate. They have moreover discovered that the use of such a polishing medium enables the polishing to be carried out at a practical CMP rate even without incorporating any solid abrasive grains in the polishing medium.

This is considered due to the fact that the scraping by friction with a polishing pad takes place in place of the effect of scraping by the friction with solid abrasive grains in conventional cases. According to the present invention, the water-soluble polymer is added to a metal polishing medium containing an oxidizing agent for the polishing object, a metal-oxide-dissolving agent, a protective-film-forming agent and water, whereby the CMP rate can be made higher while the etching rate is kept low.

As to the value of etching rate, it has been found that a preferable flattening effect can be achieved as long as the etching rate is controlled to 10 nm/minute or less. As long as the lowering of CMP rate is within a tolerable range, it is desirable for the etching rate to be much lower. As long as the etching rate is controlled to 5 nm/minute or less, the dishing can be kept to a degree not coming into question even when, e.g., the CMP is performed in excess by about 50% (i.e., CMP is performed for a time 1.5 times that necessary for removing the polishing object). As long as the etching rate can further be controlled to 1 nm/minute or less, the dishing does not come into question even when the CMP is performed in excess by about 100% or more.

Accordingly, the present invention provides a polishing medium for CMP, comprising an oxidizing agent, a metal-oxide-dissolving agent, a protective-film-forming agent, a water-soluble polymer, and water, and a polishing method making use of this polishing medium.

In order to achieve much higher CMP rate, higher flattening, lower dishing level and lower erosion level, the polishing medium for CMP may preferably satisfy at least one of the following (1) to (4), and may particularly preferably satisfy all of them.

(1) That the water-soluble polymer has a weight-average molecular weight of 500 or more.

This enables the CMP rate to be made higher while the etching rate is kept low. The water-soluble polymer may preferably have a weight-average molecular weight of 500 or more, more preferably 1,500 or more, and particularly preferably 5,000 or more. The upper limit of the weight-average molecular weight is not particularly defined. From the viewpoint of solubility, it may preferably be 5,000,000 or less.

As the water-soluble polymer, two or more polymers each having a weight-average molecular weight of 500 or more but a weight-average molecular weight different from each other may preferably be used in combination, which may be water-soluble polymers of the same type or may be water-soluble polymers of different types.

Incidentally, the weight-average molecular weight is determined by measurement on a GPC (gel permeation chromatography) column through which an aqueous solution of the water-soluble polymer is flowed.

(2) That the polishing medium has a coefficient of kinetic friction of 0.25 or more.

Where the protective-film-forming agent is used in combination with the water-soluble polymer and the polishing medium has a coefficient of kinetic friction of 0.25 or more, the CMP rate can be made much higher while the etching rate is kept low. When compared setting a constant pressure at the time of polishing, a higher CMP rate can be achieved as a higher coefficient of kinetic friction the metal polishing medium used has.

From the results of an experiment made by the present inventors, it is known that the coefficient of kinetic friction between a metal film and a metal (polishing cloth via the polishing medium for CMP comes to less than 0.25 when the content of the protective-film-forming agent in 100 g of the metal polishing medium without containing the water-soluble polymer is in a range of 0.0001 mol or more.

Here, the coefficient of kinetic friction is a coefficient obtained where the force applied to a wafer carrier when the metal film on the surface of a wafer is polished, i.e., kinetic frictional force, is divided by polishing pressure. Stated specifically, it is determined by calculation from measurements of tensile stress or the like.

The polishing medium for CMP of the present invention may more preferably have a coefficient of kinetic friction of 0.35 or more, and particularly preferably 0.45 or more.

(3) That the polishing medium has a viscosity by Ubbelode viscometer (hereinafter "Ubbelode's viscosity") of from 0.95 mPa·s (0.95 cP) to 1.5 mPa·s (1.5 cP).

Where the polishing medium has a Ubbelode's viscosity of from 0.95 mPa·s (0.95 cP) to 1.5 mPa·s (1.5 cP), the CMP rate can be made much higher while the etching rate is kept low. When compared setting a constant pressure at the time of polishing, a higher CMP rate can be achieved as a higher Ubbelode's viscosity the metal polishing medium used has.

The Ubbelode's viscosity is the value obtained where the time in which the polishing medium for CMP, kept at a liquid temperature of 25° C. in a glass tube for measuring Ubbelode's viscosity, moves over a specified distance is measured and the resultant movement time is multiplied by a constant (JIS K2283). The polishing medium may more preferably have a Ubbelode's viscosity of from 0.96 to 1.3 mPa·s (1.3 cP), and particularly preferably from 0.97 mPa·s (0.97 cP) to 1.0 mPa·s (1.0 cP). If its Ubbelode's viscosity is less than 0.95 mPa·s (0.95 cP), a low CMP rate tends to result. If it is more than 1.5 mPa·s (1.5 cP), the CMP rate tends to show a poor wafer in-plane uniformity.

(4) That the polishing medium has a point-of-inflection pressure of 5 kPa (50 gf/cm$^2$) or more.

Where the polishing medium has a point-of-inflection pressure of 5 kPa (50 gf/cm$^2$) or more, the effect of achieving high flattening, low dishing level and low erosion level can more effectively be brought out. Here, the point-of-inflection pressure refers to the polishing pressure at which the CMP rate rises abruptly. Stated specifically, it is the polishing pressure (intermediate value) in a region where the CMP rate increases from 10 nm/minute or less to 50 nm/minute or more, and is determined by measuring the rate of polishing (CMP rate) under various polishing pressure.

The polishing medium may preferably have a point-of-inflection pressure of 5 kPa (50 gf/cm$^2$) or more, and more preferably 10 kPa (100 gf/cm$^2$) or more. If its point-of-inflection pressure is less than 5 kPa (50 gf/cm$^2$), the effect of high flattening tends to be less brought out.

BEST MODES FOR PRACTICING THE INVENTION

Figure 1:
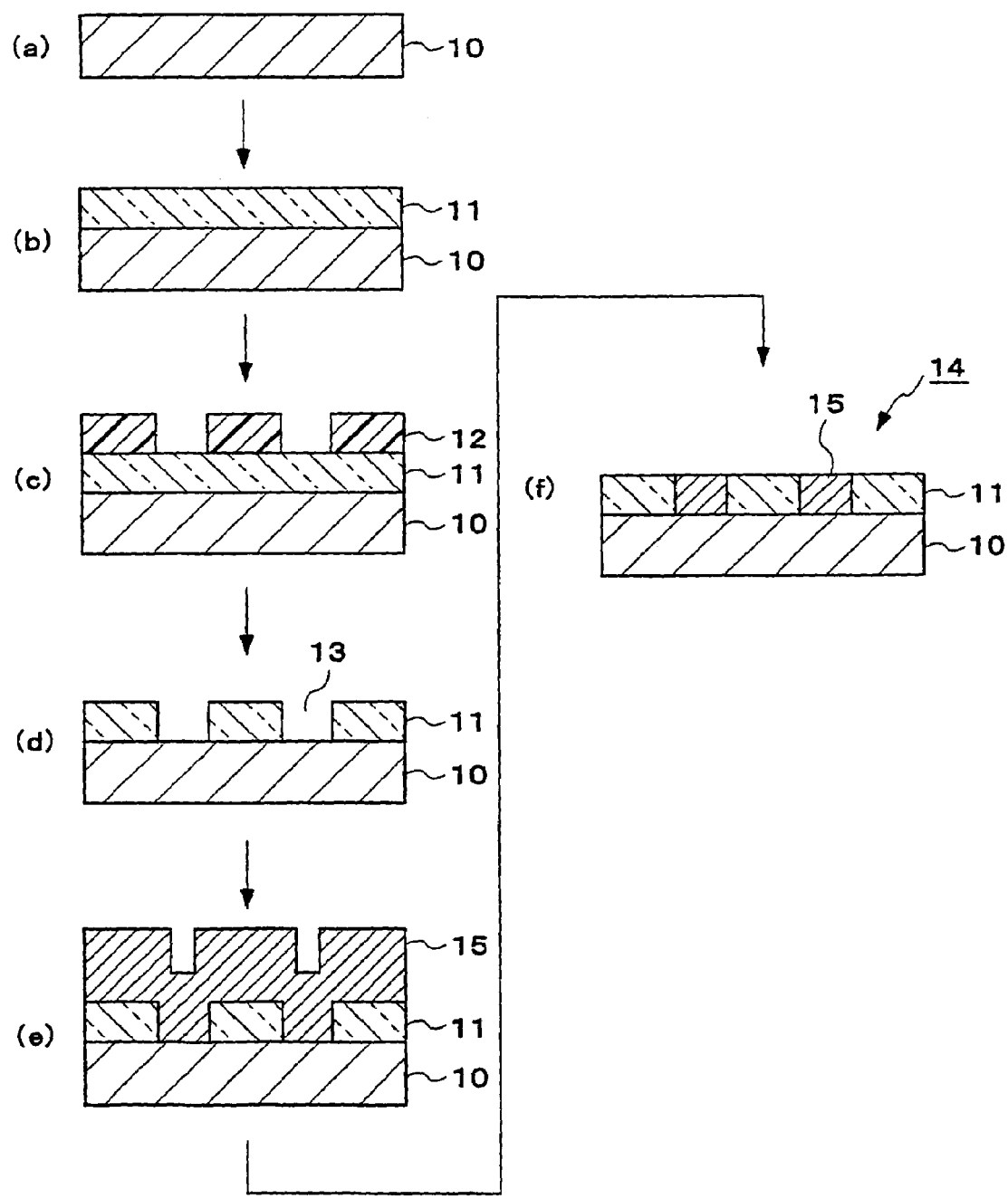
FIG. 1 is an illustration showing the steps of polishing a substrate member in Examples.

A. Composition of Polishing Medium:

The polishing medium for CMP of the present invention comprises an oxidizing agent, a metal-oxide-dissolving agent, a protective-film-forming agent, a water-soluble polymer, and water. The respective components are described below.

(1) Oxidizing Agent:

The oxidizing agent to be contained in the polishing medium for CMP of the present invention is a compound having oxidizing power on the polishing object. Stated specifically, it may include hydrogen peroxide, nitric acid, potassium periodate, hypochlorous acid and ozone water. Of these, hydrogen peroxide is particularly preferred. Any one compound of these may be used alone, or two or more compounds may be used in combination.

Where the substrate member is a silicon substrate member including devices for integrated circuits, it is undesirable for it to be contaminated with alkali metals, alkaline earth metals, halides and so forth. Hence, it is preferable for the oxidizing agent not to contain any involatile component. The ozone water may undergo a great compositional change with time. Hence, the hydrogen peroxide is most suited for the present invention. However, where the substrate member to be polished is a glass substrate member not including any semiconductor devices, an oxidizing agent containing an involatile component may be used without any problem.

The oxidizing agent component may preferably be mixed in an amount of from 0.003 mol to 0.7 mol, more preferably from 0.03 mol to 0.5 mol, and particularly preferably from 0.2 mol to 0.3 mol, based on the total weight 100 g of the oxidizing agent, metal-oxide-dissolving agent, protective-film-forming agent, water-soluble polymer and water. If it is mixed in an amount of less than 0.003 mol, the metal may insufficiently be oxidized. If it is more than 0.7 mol, the polishing surface tends to be roughed.

(2) Metal-Oxide-Dissolving Agent:

As the metal-oxide-dissolving agent to be contained in the polishing medium for CMP of the present invention, at least one of an organic acid, an organic-acid ester, an organic-acid ammonium salt and sulfuric acid is preferred.

The metal-oxide-dissolving agent may preferably be water-soluble, and may also be mixed in the state of an aqueous solution. As examples of metal-oxide-dissolving agents preferable for the present invention they may include organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid and citric acid; esters of these organic acids; salts (such as ammonium salts) of these organic acids; sulfuric acid; nitric acid; ammonia; ammonium salts (e.g., ammonium persulfate, ammonium nitrate and ammonium chloride); and chromic acid. Any one compound of these may be used alone, or two or more compounds may be used in combination.

Of these, in view of easy balancing with the protective-film-forming agent, formic acid, malonic acid, malic acid, tartaric acid and citric acid are preferred. The polishing medium for CMP which makes use of any of these is suited for layered films having conductor (which may also be semiconductor) layers formed of copper, a copper alloy, a copper oxide and/or a copper alloy oxide (hereinafter these are generically termed "copper alloy" in some cases). In particular, malic acid, tartaric acid and citric acid are preferred in view of an advantage that the etching rate can effectively be controlled while practical CMP polishing rate is maintained.

The metal-oxide-dissolving agent component in the present invention may preferably be mixed in an amount of from 0 mol to 0.005 mol, more preferably from 0.00005 mol to 0.0025 mol, and particularly preferably from 0.0005 mol to 0.0015 mol, based on the total weight 100 g of the oxidizing agent, metal-oxide-dissolving agent, protective-film-forming agent, water-soluble polymer and water. If it is mixed in an amount of more than 0.005 mol, the etching tends to be controlled with difficulty.

(3) Protective-Film-Forming Agent:

The protective-film-forming agent is a compound which forms a protective film on the surface of the polishing object, and nitrogen-containing compounds (e.g., ammonia, alkylamines, amino acids, imines, azoles, and salts of these), mercaptans, glucose and cellulose are preferred.

As examples of protective-film-forming agents preferable for the present invention, they may include ammonia; alkylamines such as dimethylamine, trimethylamine, triethylamine, propylenediamine, ethylenediaminetetraacetic acid (EDTA), sodium diethyldithiocarbamate and chitosan; amino acids such as glycine, L-alanine, β-alanine, L-2-aminobuyric acid, L-norvaline, L-valine, L-leucine, L-norleucine, L-isoleucine, L-alloisoleucine, L-phenylalanine, L-proline, sarcocine, L-ornithine, L-lysine, taurine, L-serine, L-threonine, L-allothreonine, L-homoserine, L-tyrosine, 3,5-diiodo-L-tyrosine, β-(3,4-dihydroxyphenyl)-L-alanine, L-thyroxine, 4-hydroxy-L-proline, L-cystine, L-methionine, L-ethionine, L-lanthionine, L-cystathionine, L-cysteine, L-cysteic acid, L-aspartic acid, L-glutamic acid, S-(carboxymethyl)-L-cystine, 4-aminobutyric acid, L-asparagine, L-glutamine, azaserine, L-alginine, L-canavanine, L-citrulline, 6-hydroxy-L-lysine, creatine, L-kynurenine, L-histidine, 1-methyl-L-histidine, 3-methyl-L-histidine, ergothioneine, L-tryptophane, actinomycin C1, apamine, anguiotensin I, anguiotensin II and antipains; imines such as dithizone, cuproin (2,2'-biquinoline), neocuproin (2,9-dimethyl-1,10-phenanthroline), basocuproin (2,9-dimethyl-4,7-diphenyl-1,10-phenanthroline) and cuperazone (biscyclohexanoneoxalylhydrazone); azoles such as benzimidazole-2-thiol, triazinedithiol, triazinetrithiol, 2-[2-(benzothiazolyl)]thiopropionic acid, 2-[2-(benzothiazolyl)]thiobutyric acid, 2-mercaptobenzothiazole, 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazole methyl ester, 4-carboxyl-1H-benzotriazole butyl ester, 4-carboxyl-1H-benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole and bis[(1-benzotriazolyl)methyl]phosphonic acid; mercaptans such as nonylmercaptan and dodecylmercaptan; and saccharides such as glucose and cellulose. Any one compound of these may be used alone, or two or more compounds may be used in combination.

Of these, chitosan, ethylenediaminetetraacetic acid, L-tryptophane, cuperazone, triazinedithiol, benzotriazole, 4-hydroxybenzotriazole, 4-carboxyl-1H-benzotriazole butyl ester, tolyltriazole and naphthotriazole are preferred in order to achieve both a high CMP rate and a low etching rate.

The protective-film-forming agent may be mixed in an amount of from 0.0001 mol to 0.05 mol, more preferably from 0.0003 mol to 0.005 mol, and particularly preferably from 0.0005 mol to 0.0035 mol, based on the total weight 100 g of the oxidizing agent, metal-oxide-dissolving agent, protective-film-forming agent, water-soluble polymer and water. If it is mixed in an amount of less than 0.0001 mol, the etching tends to be controlled low with difficulty. If it is in an amount of more than 0.05 mol, a low CMP rate tends to result.

(4) Water-Soluble Polymer:

As water-soluble polymers preferable for the present invention, they may include polysaccharides such as alginic acid, pectic acid, carboxymethyl cellulose, agar, curdlan and pullulan; polycarboxylic acids such as polyaspertic acid, polyglutamic acid, polylysine, polymalic acid, polymethacrylic acid, ammonium polymethacrylate, sodium polymethacrylate, polymaleic acid, polyitaconic acid, polyfumaric acid, poly(p-styrenecarboxylic acid), polyacrylic acid, polyacrylamide, aminopolyacrylamide, methyl polyacrylate, ethyl polyacrylate, ammonium polyacrylate, sodium polyacrylate, polyamic acid, polyamic acid ammonium salt and polyamic acid sodium salt and polyglyoxylic acid, polycarboxylic esters, and salts thereof; and vinyl polymers such as polyvinyl alcohol, polyvinyl pyrrolidone and polyacrolein. Any one compound of these may be used alone, or two or more compounds may be used in combination.

Where, however, the substrate member to be polished is a silicon substrate member for semiconductor integrated circuits, acids or ammonium salts are preferred because it is undesirable for it to be contaminated with alkali metals, alkaline earth metals, halides and so forth. Where the substrate member is a glass substrate member, this does not necessarily apply.

Of these compounds, pectic acid, agar, polymalic acid, polymethacrylic acid, polyacrylic acid, polyacrylamide, polyvinyl alcohol and polyvinyl pyrrolidone, esters of these and ammonium salts of these are particularly preferred.

The water-soluble polymer may be mixed in an amount of from 0.001 to 0.3% by weight, more preferably from 0.003 to 0.1% by weight, and particularly preferably from 0.01 to 0.08% by weight, based on the total weight 100 g of the oxidizing agent, metal-oxide-dissolving agent, protective-film-forming agent, water-soluble polymer and water. If it is mixed in an amount of less than 0.001% by weight, the effect attributable to its use in combination with the protective-film-forming agent tends not to be brought out in low etching control. If it is in an amount of more than 0.3% by weight, a low CMP rate tends to result.

(5) Others:

The polishing medium for CMP of the present invention may optionally appropriately contain additives. The solid abrasive grains need not substantially be contained, or may be contained. Also, in the case of the polishing medium for CMP of the present invention which does not contain any abrasive grains, the CMP proceeds by the action of the friction with a polishing pad which is mechanically much softer than the solid abrasive grains, and hence the polishing defects can be made to dramatically less occur.

B. Characteristic Features of Polishing Medium:

Different from conventional polishing mediums making use of only the protective-film-forming agent, the polishing medium of the present invention can flatten polishing objects by CMP without relying on any strong mechanical friction caused by solid abrasive grains, but by the action of the friction with the polishing pad which is much softer than them.

In the polishing medium for CMP of the present invention, since the protective-film-forming agent is used in combination with the water-soluble polymer, the etching is controlled but, in the friction with the polishing pad, the protective-film-forming agent does not function and the CMP proceeds, as so presumed.

In general, in CMP, the degree at which the polishing mars occur depends on the particle diameter, particle size distribution and shape of the solid abrasive grains. The decrease in layer thickness (hereinafter "erosion") due to the scrape of insulating film and the deterioration of flattening effect also depends on the particle diameter of the solid abrasive grains and the physical properties of the polishing pad.

When the surface of metal film, in particular, copper film is treated with BTA, the dishing of the metal film is considered to depend on the hardness of the polishing pad and the chemical properties of the polishing medium. More specifically, hard solid abrasive grains are necessary for the progress of CMP, but are undesirable for the improvement of flattening effect in CMP and perfectness (free of any damage such as polishing mars) of CMP surface. From this fact, it is seen that in fact the flattening effect depends on the properties of the polishing pad which is softer than the solid abrasive grains.

This matter is described taking the case of BTA from among protective-film-forming agents. It is considered that, upon exposure of the copper alloy film surface to a liquid containing BTA, a film of a polymer-like complex compound having a structure of Cu(I)BTA or Cu(II)BTA as the chief skeleton is formed by the reaction of copper or an oxide thereof with BTA. This film is fairly strong. Hence, where a polishing medium for CMP which contains 1% by weight of BTA is used, the film is usually little polished away even when solid abrasive grains are contained in this polishing medium. Also, where only the water-soluble polymer is mixed in the polishing medium for CMP and any protective-film-forming agent is not added, it is difficult especially to control etching rate low, resulting in an insufficient protective effect. It is conventionally known that a protective film of a different type is thus formed depending on the type of the protective-film-forming agent. However, the combination of the protective-film-forming agent with the water-soluble polymer as shown in the present invention enables achievement of both a high CMP rate and a low etching rate and moreover makes unnecessary any strong friction caused by solid abrasive grains.

Thus, the polishing medium for CMP of the present invention is very favorable for the CMP of copper alloys and furthermore the formation of buried patterns making use of the same.

C. Polishing Method:

The present invention provides a polishing method comprising polishing a polishing object film of a metal or metal oxide by the use of the above polishing medium for CMP of the present invention to remove at least part of the polishing object film. The polishing medium for CMP of the present invention can achieve high flattening at a high speed, even when the polishing object film is a layered film comprised of copper, a copper alloy, a copper oxide and/or a copper alloy oxide.

The polishing method of the present invention can polish the polishing object film by feeding the polishing medium for CMP of the present invention to a polishing cloth on a polishing platen, and simultaneously bringing a substrate having the polishing object film thereon, into contact with the polishing cloth, in the state of which the polishing platen and the substrate (with film) are relatively moved.

In the present invention, a metal film comprised of copper or a copper alloy (such as copper/chromium) is formed on a substrate having dales at its surface, filling the dales with the metal film. This substrate member is subjected to CMP using the polishing medium according to the present invention, whereupon the metal film at the part of hills of the substrate member is selectively polished away by CMP and the metal film at the part of dales is left therein, thus the desired conductor pattern is obtained.

In the polishing method of the present invention, a commonly available polishing apparatus may be used which has a holder for holding the polishing object such as a semiconductor substrate member and a platen to which a polishing cloth (pad) has been fastened (fitted with, e.g., a motor whose number of revolutions is variable). As the polishing cloth, commonly available nonwoven fabric, foamed polyurethane, porous fluorine resin and so forth may be used without any particular limitations.

There are no particular limitations on polishing conditions. It is preferable to rotate the platen at a low revolution of 200 rpm or less so that the substrate does not rush out therefrom. The semiconductor substrate member having the polishing object film may preferably be pressed against the polishing cloth at a pressure of from 10 to 100 kPa (100 to 1,000 gf/cm$^2$), and more preferably from 10 to 50 kPa (100 to 500 gf/cm$^2$) in order to satisfy the wafer in-plane uniformity of polishing rate and the flatness of patterns.

In the course of the polishing, the polishing medium for CMP is continuously fed to the polishing cloth by means of a pump or the like. There are no particular limitations on this feed quantity. It is preferable for the polishing-cloth surface to be always covered with the polishing medium.

The semiconductor substrate member on which the polishing has been completed may preferably be washed thoroughly in running water and thereafter be set on a spin dryer or the like to blow off any drops of water adhering onto the semiconductor substrate member, followed by drying.

The polishing method of the present invention is suited for the polishing of copper alloy wirings in semiconductor devices. For example, as shown in FIG. 1, on the surface of a silicon wafer 10 [FIG. 1 (*a*)], a silicon dioxide film 11 is formed [FIG. 1 (*b*)], a resist layer 12 having a stated pattern is formed on the surface thereof [FIG. 1 (*c*)], a dale 13 is formed in the silicon dioxide film 11 by dry etching and then the resist layer 12 is removed [FIG. 1 (*d*)], a metal such as copper is deposited by vacuum deposition, plating or CVD in such a way that it covers the surface of the silicon dioxide film 11 and the uncovered part of the silicon wafer 10, to provide a wiring layer 15 [FIG. 1 (*e*)], and thereafter its surface is polished by CMP. Thus, as shown in FIG. 1 (*f*), a semiconductor substrate member 14 having buried wirings 15 of copper is obtained.

EXAMPLES

The present invention is specifically described below by giving Examples. The present invention is by no means limited by these Examples.

(1) Preparation of Polishing Medium for CMP

To 0.15 part by weight of DL-malic acid (a guaranteed reagent), 70 parts by weight of water was added to effect dissolution, and a solution prepared by dissolving 0.2 part by weight of benzotriazole in 0.8 part by weight of methanol was added thereto. Further, 0.05 part by weight (solid-matter weight) of a water-soluble polymer was added (but, in only Comparative Example 3, the water-soluble polymer was mixed in an amount of 1.5 parts by weight). Finally, 33.2 parts by weight of hydrogen peroxide water (a guaranteed reagent, an aqueous 30% by weight solution) was added. Thus, polishing mediums for CMP were obtained. Surface protective agents and water-soluble polymers used in Examples and Comparative Examples are shown in Tables 1 to 3.

(2) Polishing

Using the polishing mediums for CMP thus obtained, CMP was carried out under conditions shown below. Substrate member to be polished: Silicon substrate with a copper film formed thereon in a thickness of 1 μm. Polishing pad: IC1000 (available from Rodel Inc.). Polishing pressure: 21 kPa (210 gf/cm$^2$) (point-of-inflection pressure: 0 to 50 kPa (0 to 500 gf/cm$^2$)).

(3) Polished-Product Evaluation Items

CMP rate: Determined by calculation from electrical resistance value in respect of the difference in layer thickness before and after the copper film was polished by CMP.

Etching rate:

Determined by calculation from electrical resistance value in respect of the difference in copper layer thickness before and after immersion in the polishing medium having been stirred.

(4) Evaluation Results

The results of evaluation on the above items in Examples and Comparative Examples are shown in Tables 1 to 3.

TABLE 1

| | Example | | | | | |
|---|---|---|---|---|---|---|
| | 1 | 2 | 3 | 4 | 5 | 6 |
| Protective-film-forming agent | benzotriazole | | | | | |
| Water-soluble polymer (molecular weight MW) | pectic acid (50000) | agar-agar (40000) | (300) | polyacrylic acid (5000) | (12000) | (90000) |
| CMP rate (nm/minute) | 160 | 132 | 85 | 147 | 153 | 321 |
| Etching rate nm/minute | 1.0 | 1.1 | 1 | 0.9 | 0.9 | 0.9 |
| Point-of-inflection pressure (kPa) | 3 | 3 | 2 | 30 | 15 | 6 |
| Ubbelode's viscosity (mPa·s) | 0.95 | 0.95 | 0.94 | 0.94 | 0.95 | 0.98 |
| Coefficient of kinetic friction | 0.34 | 0.37 | 0.19 | 0.27 | 0.30 | 0.50 |

TABLE 2

| | Example | | | | | |
|---|---|---|---|---|---|---|
| | 7 | 8 | 9 | 10 | 11 | 12 |
| Protective-film-forming agent | benzotriazole | | | | | |
| Water-soluble polymer (molecular weight MW) | polyacrylamide (1500) | (10000) | (800000) | polyvinyl alcohol (23000) | (66000) | (88000) |
| CMP rate | 162 | 124 | 162 | 132 | 135 | 135 |

TABLE 2-continued

| | Example | | | | | |
|---|---|---|---|---|---|---|
| | 7 | 8 | 9 | 10 | 11 | 12 |
| (nm/minute) | | | | | | |
| Etching rate (nm/minute) | 1.0 | 1.0 | 1.0 | 0.9 | 0.9 | 0.9 |
| Point-of-inflection pressure (kPa) | 6 | 5 | 5 | 9 | 7 | 6 |
| Ubbelode's viscosity (mPa·s) | 0.94 | 0.96 | 0.99 | 0.97 | 0.98 | 0.98 |
| Coefficient of kinetic friction | 0.27 | 0.32 | 0.35 | 0.48 | 0.54 | 0.57 |

TABLE 3

| | Example | | Comparative Example | | | |
|---|---|---|---|---|---|---|
| | 13 | 14 | 1 | 2 | 3 | 4 |
| Protective-film-forming agent | benzotriazole | | | none | | |
| Water-soluble polymer (molecular weight MW) | polyvinyl pyrrolidone (40000) | (1200000) | none | poly-acrylamide (800000) | | none |
| CMP rate (nm/minute) | 91 | 99 | 80 | 112 | 20 | 145 |
| Etching rate (nm/minute) | 0.8 | 0.8 | 0.7 | 39.6 | 5.0 | 50.6 |
| Point-of-inflection pressure (kPa) | 8 | 6 | 2 | none | none | none |
| Ubbelode's viscosity (mPa.s) | 0.95 | 0.96 | 0.94 | 0.99 | 1.6 | 0.94 |
| Coefficient of kinetic friction | 0.40 | 0.45 | 0.16 | 0.42 | 0.25 | 0.23 |

To evaluate actual CMP performance, a silicon substrate member in which grooves of 0.5 μm in depth were formed in the insulating layer and a copper film was formed by known sputtering and was buried in the grooves by known heat treatment was subjected to CMP. After the CMP, whether or not any erosion and polishing mars occurred was examined by visual observation, optical-microscope observation and electron-microscope observation of the substrate member. As the result, the erosion and the polishing mars were not seen to have occurred in all Examples.

In Comparative Example 1, in which only the protective-film-forming agent was mixed in the polishing medium and the water-soluble polymer was not added, the CMP rate was low. Also, in Comparative Examples 2 and 3, in which only the water-soluble polymer was mixed and the protective-film-forming agent was not added, and in Comparative Example 4, in which both the protective-film-forming agent and the water-soluble polymer were not mixed, the etching rate was so high that the dishing occurred in a large level.

On the other hand, in Examples 1 to 14, in which the protective-film-forming agent and the water-soluble polymer were used in combination, the CMP rate was high although the etching rate was low, making it possible to shorten the polishing time. Moreover, the dishing was only in a small level, and the high flattening was achievable. Also, Examples 4 to 6, in which the molecular weight of the water-soluble polymer was 500 more, showed a higher CMP rate than Example 3, in which it was not more than 500, thus it was found preferable for the water-soluble polymer to have a molecular weight of 500 or more.

In Comparative Example 1, in which the polishing medium had a coefficient of kinetic friction of 0.16, which was lower than 0.25, the CMP rate was low. Also, the polishing medium of Comparative Example 4, too, having a low coefficient of kinetic friction of 0.23, showed a higher etching rate than the CMP rate, and hence caused the dishing in a large level. In Comparative Examples 1 and 4, having a Ubbelode's viscosity of 0.94 mPa·s (0.94 cP), which was lower than 0.95, the CMP rate was low. Also, in Comparative Example 1, having a point-of-inflection pressure of 2 kPa (20 gf/cm$^2$), which was lower than 5 kPa (50 gf/cm$^2$), the CMP rate was low. Still also, in Comparative Examples 2 to 4, in which the point-of-inflection pressure was not present, the etching rate was so high that the dishing occurred in a large level.

POSSIBILITY OF INDUSTRIAL APPLICATION

As described above, according to the polishing medium for CMP of the present invention, highly reliable buried metal film patterns can be formed in a good efficiency.

What is claimed is:

1. A polishing medium for chemical-mechanical polishing, comprising an oxidizing agent, a protective-film-forming agent, a water-soluble polymer excluding poly(oxyethylene)lauryl ether, polyvinyl alcohol, gelatin and carboxymethylcellulose, and water, wherein said water-soluble polymer has a weight-average molecular weight of 500 or more.

2. The polishing medium for chemical-mechanical polishing according to claim 1, wherein said water-soluble polymer comprises two or more polymers each having a weight-average molecular weight of 500 or more, wherein but a weight-average molecular weight of said polymers are different from each other.

3. The polishing medium for chemical-mechanical polishing according to claim 1, wherein said water-soluble polymer has a weight-average molecular weight of 1,500 or more.

4. The polishing medium for chemical-mechanical polishing according to claim 1, wherein said water-soluble polymer has a weight-average molecular weight of 5,000 or more.

5. A polishing medium for chemical-mechanical polishing, comprising an oxidizing agent, a protective-film-forming agent, a water-soluble polymer and water, wherein the water-soluble polymer is at least one selected from the group consisting of alginic acid, pectic acid, agar, curdlan and pullulan.

6. A polishing medium for chemical-mechanical polishing, comprising an oxidizing agent, a protective-film-forming agent, a water-soluble polymer and water, wherein the water-soluble polymer is at least one selected from the group consisting of polyvinyl pyrrolidone and polyacrolein.

* * * * *